(12) United States Patent
Ikeda

(10) Patent No.: US 7,116,462 B2
(45) Date of Patent: Oct. 3, 2006

(54) ELECTROSTATIC DRIVE TYPE MEMS DEVICE AND MANUFACTURING METHOD THEREOF, OPTICAL MEMS DEVICE, LIGHT MODULATION DEVICE, GLV DEVICE, AND LASER DISPLAY

(75) Inventor: Koichi Ikeda, Kanagawa (JP)

(73) Assignee: Sony Corporation, (JP)

( * ) Notice: Subject to any disclaimer, the term of this patent is extended or adjusted under 35 U.S.C. 154(b) by 165 days.

(21) Appl. No.: 10/468,873

(22) PCT Filed: Dec. 16, 2002

(86) PCT No.: PCT/JP02/13127

§ 371 (c)(1),
(2), (4) Date: Aug. 25, 2003

(87) PCT Pub. No.: WO03/055788

PCT Pub. Date: Jul. 10, 2003

(65) Prior Publication Data

US 2004/0076008 A1    Apr. 22, 2004

(30) Foreign Application Priority Data

Dec. 26, 2001  (JP) .............................. 2001-394880

(51) Int. Cl.
G02B 26/00    (2006.01)
(52) U.S. Cl. ..................................... 359/291
(58) Field of Classification Search ................ 359/291, 359/290, 295, 298, 224, 318, 572, 573; 348/741, 348/750, 751

See application file for complete search history.

(56) References Cited

U.S. PATENT DOCUMENTS

| 4,668,865 | A | 5/1987 | Gimzewski et al. |
| 6,219,015 | B1 * | 4/2001 | Bloom et al. ................. 345/87 |
| 6,663,788 | B1 * | 12/2003 | Kowarz et al. ............... 216/24 |
| 2001/0024325 | A1 | 9/2001 | Kowarz |

FOREIGN PATENT DOCUMENTS

| JP | 6-281443 A1 | 10/1994 |
| JP | 7-98328 A1 | 4/1995 |
| WO | WO-97/26569 A1 | 7/1997 |

* cited by examiner

Primary Examiner—Hung Xuan Dang
Assistant Examiner—Tuyen Tra
(74) Attorney, Agent, or Firm—Rader, Fishman & Grauer PLLC; Ronald P. Kananen

(57) ABSTRACT

An electrostatic drive type MEMS device and a manufacturing method thereof are provided, in which flattening the surface of a driving side electrode, improving performance, and furthering the improvements of the degree of freedom of designing in the manufacturing process are implemented. In addition, a GLV device using this MEMS device is provided, and further a laser display using this GLV device is also provided. The electrostatic drive type MEMS device includes a substrate side electrode and a beam having a driving side electrode driven by electrostatic attraction force or electrostatic repulsion force that acts between the substrate side electrode and driving side electrode, in which the substrate side electrode is formed of an impurities-doped conductive semiconductor region in a semiconductor substrate.

18 Claims, 12 Drawing Sheets

ELECTROSTATIC DRIVE TYPE MEMS DEVICE AND MANUFACTURING METHOD THEREOF, OPTICAL MEMS DEVICE, LIGHT MODULATION DEVICE, GLV DEVICE, AND LASER DISPLAY

TECHNICAL FIELD

The present invention relates to an electrostatic drive type MEMS device and a manufacturing method thereof, an optical MEMS device, a light modulation device, a GLV device and a laser display.

BACKGROUND ART

With the advances in microscopic manufacturing technology, much attention has been focused on so-called micromachine (MEMS: Micro Electro Mechanical Systems, ultra-miniature electric, mechanical compound) devices and miniature devices in which MEMS devices are incorporated.

A MEMS device is a device that is formed on a substrate such as a silicon substrate, glass substrate or the like as a microscopic structure, and electrically and further, mechanically unites a driving body outputting mechanical driving force with a semiconductor integrated circuit or the like that controls the mechanical body. A basic feature of the MEMS device is that a mechanically structured driving body is incorporated in a part of the device, and the driving body is electrically driven by the use of coulombic attraction force between electrodes or the like.

FIGS. 13 and 14 show a typical composition of an optical MEMS device that is applied to an optical switch and a light modulation device by taking advantage of the reflection or diffraction of light.

An optical MEMS device 1 shown in FIG. 13 includes a substrate 2, a substrate side electrode 3 formed on the substrate 2, a beam 6 having a driving side electrode 4 that is disposed in parallel to oppose the substrate side electrode 3, and a support part 7 for supporting one end of the beam 6. The beam 6 and substrate side electrode 3 are electrically insulated by a void 8 therebetween.

A required substrate such as a substrate with an insulation film formed on a semiconductor substrate of, for example, silicon (Si), gallium arsenic (GaAs) and the like, or an insulative substrate such as a glass substrate is used for the substrate 2. The substrate side electrode 3 is formed of a polycrystalline silicon film by doping impurities therein, metal film (Cr deposited film, for example), and the like. The beam 6 is composed of, for example, an insulation film 5 such as silicon nitride film (SiN film) or the like and the driving side electrode 4 serving as a reflective film consisting of, for example, Al film of 100 nm or so in thickness. The beam 6 is formed in a so-called cantilever fashion with its one end supported by the support part 7.

In the optical MEMS device 1, the beam 6 displaces itself in response to electrostatic attraction force or electrostatic repulsion force generated between the substrate side electrode 3 and driving side electrode 4 by an electric potential that is applied to the substrate side electrode 3 and driving side electrode 4, and as shown by a solid line as well as a broken line in FIG. 13, for example, the beam 6 displaces itself into a parallel state or inclined state relative to the substrate side electrode 3.

An optical MEMS device 11 shown in FIG. 14 is composed of a substrate 12, a substrate side electrode 13 formed on the substrate 12 and a beam 14 that straddles the substrate side electrode 13 in a bridge-like fashion. The beam 14 and substrate side electrode 13 are insulated by a void 10 therebetween.

The beam 14 is composed of a bridge member 15 of, for example, a SiN film that rises up from the substrate 12 and straddles a substrate side electrode 13 in a bridge-like fashion and a driving side electrode 16 of, for example, an Al film of 100 nm or so in thickness that, serving as a reflective film, is provided on the bridge member 15 to oppose the substrate side electrode 13 in parallel to each other. The substrate 12, substrate side electrode 13, beam 14 and the like may employ similar compositions and materials to those explained in FIG. 13. The beam 14 is formed in a so-called bridge-like fashion in which the both ends thereof are supported.

In the optical MEMS device 11, the beam 14 displaces itself in response to electrostatic attraction force or electrostatic repulsion force generated between the substrate side electrode 13 and driving side electrode 16 by an electric potential that is applied to the substrate side electrode 13 and driving side electrode 16, and as shown by a solid line and a broken line as well in FIG. 14, for example, the beam 14 displaces itself into a parallel state or fallen state relative to the substrate side electrode 13.

With these optical MEMS devices 1, 11, light is irradiated on the surfaces of the driving side electrodes 4, 16 serving as a light reflective film, and by taking advantage of differences in the direction of reflected light depending upon positions into which the beams 6, 14 are driven, these MEMS devices can be applied to an optical switch having a switch function by detecting the reflected light of one direction.

Further, the optical MEMS devices 1, 11 are applicable as a light modulation device for modulating the strength of light. When light reflection is taken advantage of, the strength of light is modulated by vibrating the beams 6, 14 according to the amount of reflected light in one direction per unit time. This light modulation device runs on a so-called time modulation.

When light diffraction is taken advantage of, a light modulation device is composed of a plurality of beams 6, 14 disposed in parallel relative to the common substrate side electrodes 3, 13, and by varying the height of, for example, driving side electrodes serving as a light reflective film with the movements of every other beam 6, 14 such as moving closer to or moving away from the common substrate side electrodes 3, 13, the strength of reflected light from the driving side electrodes is modulated by means of light diffraction. This light modulation device runs on a so-called space modulation.

FIG. 15, consisting of FIGS. 15A and 15B, shows a composition of the GLV (Grating Light Valve) device developed by SLM (Silicon Light Machines) as a light strength modulation device for a laser display, that is, a light modulator.

In a GLV device 21, as shown in FIG. 15A, a common substrate side electrode 23 of a refractory metal, for example, tungsten or titanium film or a nitride film thereof, or of a poly-silicon thin film is formed on an insulation substrate 22 such as a glass substrate or the like, and a plurality of beams 24, in this example, six beams [$24_1$, $24_2$, $24_3$, $24_4$, $24_5$, $24_6$] straddling across the substrate side electrode 23 in a bridge-like fashion are disposed in parallel. The compositions of the substrate side electrode 23 and beams 24 are the same as those explained in FIG. 14. Namely, as shown in FIG. 15B, a reflective film cum driving side electrode 26 of an Al film of 100 nm or so in thickness is formed on the surface, which is in parallel to the substrate side electrode 23, of a bridge member 25 of a SiN film, for example.

The beam 24 composed of the bridge member 25 and reflective film cum driving side electrode 26 provided thereon is a portion conventionally called a ribbon.

The aluminum film (Al film) used as the reflective film cum driving side electrode 26 is a suitable metal as the material for optical components because of the following reasons: (1) it is a metal that can be comparatively easily formed into a film; (2) the dispersion of reflectance with respect to wavelengths in a visible light range is small; (3) alumina natural oxidation film generated on the surface of the Al film functions as a protective film to protect a reflective surface.

Further, the SiN film (silicon nitride film) composing the bridge member 25 is formed by the use of the low-pressure CVD method, and the SiN film is selected by reason of the physical values of its strength, elasticity constant, and the like being suitable for mechanically driving the bridge member 25.

When a voltage is applied between the substrate side electrode 23 and reflective film cum driving side electrode 26, the above-mentioned beam 24 moves closer to the substrate side electrode 23 according to the above-mentioned electrostatic phenomenon, and when the application of the voltage is stopped, the beam 24 moves away from the substrate side electrode 23 and returns to an original position.

The GLV device 21 alternately varies the height of the reflective film cum driving side electrode 26 with the movements of the plurality of beams 24 such as moving closer to or moving away from the substrate side electrode 23 (that is, those movements of every other beams), and modulates the strength of light reflected on the driving side electrode 26 by means of the diffraction of light (one beam spot is irradiated on the whole of six beams 24).

Mechanical characteristics of the beam driven by taking advantage of electrostatic attraction force and electrostatic repulsion force are almost predicated on the physical properties of the SiN film formed by the use of the CVD method or the like, with an Al film mainly functioning as a mirror.

By the way, as described above, the substrate side electrode in the MEMS device is formed on an insulation layer of a semiconductor substrate made of silicon, GaAs, or the like, or an insulative substrate such as a glass substrate or the like. As for materials of the electrode, a polycrystalline silicon film or metal film, in which impurities are doped, is used. However, since these materials have a crystalline structure, unevenness occurs on the surface thereof. For example, in the case of a polycrystalline silicon electrode, according to an analysis by AFM (an atomic force microscope), controlling the relative roughness RMS (root mean square) value of a surface can be achieved by strictly carrying out temperature control in the manufacturing process, and it is a well known fact that a surface relative roughness of 20 nm or more easily occurs after the implementation of a conventional film forming process and a semiconductor manufacturing process that have been practiced so far. The degree of the roughness depends on materials and film forming methods as well.

This surface unevenness does not pose a serious problem in terms of the electric characteristics as well as the operating characteristics of the MEMS device, but it often has become problematic in the manufacturing process of an optical MEMS device. Namely, the substrate side electrode of the above-mentioned MEMS device is usually positioned under the reflective film cum driving side electrode. In this case, surface unevenness of a lower layer film becomes sequentially transcribed to an upper layer film in the manufacturing process, thereby resulting in the forming of a driving side electrode with piled-up transcribed surface unevenness, that is, the forming of a reflective film therewith on the uppermost layer that is an optically important film surface.

For example, the MEMS device 1 mentioned above in FIG. 13 is manufactured in such a manner that the substrate side electrode 3 is formed on a substrate, and after forming the support part 7, a sacrificial layer (not shown) to form a void is provided on a surface including the substrate side electrode 3, and further, a beam is formed on the sacrificial layer, followed by forming a void 8 between the substrate side electrode 3 and the beam 6 by removing the sacrificial layer. Silicon (polycrystalline silicon, non-crystalline silicon, or the like) or a silicon oxide film is used for the sacrificial layer. When the sacrificial layer is made of silicon, it can be removed by, for example, a mixture of nitric acid and fluoric acid, or gas etching employing a gas containing fluorine (F), and when the sacrificial layer is made of an oxidized layer, it is conventionally removed by an oxygen fluoride solution, or by etching employing fluorinated carbon gas.

That is, with the optical MEMS device that is manufactured to be composed of three layers of: a substrate side electrode (a), a void forming a sacrificial layer (b), and a reflective film cum driving side electrode (c), assuming that the maximum values of surface unevenness that are observed in each of the respective layers are $R_{max}$ (a), $R_{max}$ (b), $R_{max}$ (c), there is a possibility that when the three layers are laminated, the amount of surface unevenness on the surface of the uppermost layer adds up to the sum of these maximum values.

Expressing the performance of optical components, in the MEMS device, in which aluminum (Al) is made to serve as a reflective film, 92% of reflectance of the Al film may possibly be obtained if the film is a bulk Al film. However, if there is no control on the amount of this surface unevenness, the reflectance will deteriorate by more than several percentage points, so that only 85% or so thereof can barely be obtained. In an extreme case, it is observed that the surface appears to be clouded up. Such an optical MEMS device becomes a problem when its performance as a optical device is concerned.

Further, there remains a problem concerning design. While a MEMS transducer, that is, the resonant frequency of a beam is designed by taking account of the mass of resonance, the tensile force of films in respective regions that support the driving part, and the like, in the present circumstances the values of physicality of the respective films are conventionally computed and designed by using the values of physicality where films are in an ideal thin state. However, when a RMS value is 20 nm, for example, and the thickness of a film for use becomes smaller in comparison therewith, it becomes impossible to disregard a swell from the standpoint of a film structure, thereby necessitating a redesign for a MEMS device, including a mechanical modification of the swell structure thereof, which is extremely difficult to achieve by means of tools for design that are available in the circumstances, when computing time and the accuracy of the tools are taken into account.

As shown in FIG. 16, when the substrate side electrode is formed of, for example, polycrystalline silicon, surface unevenness is expanded and transcribed onto the surface of the driving side electrode (Al film) 4 that constitutes the beam (Al/SiN laminated layer) 6, resulting in the deterioration of the light reflectance of the driving side electrode 4 functioning as a mirror.

Meanwhile, the MEMS device has a packaging process, as shown in FIGS. 17A and 17B, for the purpose of protecting the beam serving as an operating part. In this packaging process, a columnar support part 18 is formed with, for example, an oxidized silicon layer on the substrate 2, and a transparent substrate, for example, a glass substrate 9 is joined onto the columnar support part 18. Since a power supplying wiring 10 for driving the MEMS device 1 is formed at the same time as the substrate 3 is formed, a part of the columnar support part 18 takes the form of creeping over the wiring 10, so that stepped differences occur on the surface of the part of columnar support part 18 due to the wiring 10. Consequently, the glass substrate 9 of a package member is unable to be placed in close contact with the overall surface of the columnar support part 18, and surface unevenness is transcribed to a surface 18a of the columnar support part, which becomes an obstacle when the surface 18a of the columnar support part 18 is joined with the glass substrate 9 by means of, for example, the anode bonding method.

DISCLOSURE OF THE INVENTION

The present invention provides an electrostatic drive type MEMS device which aims at flattening the surface of a beam, improving its performance, and further improving the degree of freedom of designing, and manufacturing methods thereof, an optical MEMS device, an optical modulation device, GLV device, and laser display.

An electrostatic drive type MEMS device according to the present invention is composed of a substrate side electrode and a beam that is disposed to oppose the substrate side electrode and has a driving side electrode driven by electrostatic attraction force or electrostatic repulsion force that acts between the substrate side electrode and driving side electrode, with the substrate side electrode being formed of an impurities-doped conductive semiconductor region in a semiconductor substrate. The conductive semiconductor region can be formed to be electrically insulated from the peripheral region of the semiconductor substrate by being insulated and isolated by means of selective oxidation or trench isolation.

A manufacturing method of the electrostatic drive type MEMS device according to the present invention has the processes of: forming a substrate side electrode that is insulated to be isolated from other parts by doping impurities onto the surface of a semiconductor substrate, selectively forming a sacrificial layer including the upper part of the substrate side electrode, forming on the sacrificial layer a beam having a driving side electrode, and removing the sacrificial layer. The doping of the impurities is carried out by means of an ion injection method, a thermal diffusion method or a solid phase diffusion method.

With the electrostatic drive type MEMS device according to the present invention, since a substrate side electrode is formed of an impurities-doped conductive semiconductor region in a semiconductor substrate, the surface of the semiconductor substrate is maintained as the surface of the substrate side electrode and is maintained as an extremely flattened surface by a mirror finish. Therefore, the surface of the beam, which opposes the substrate side electrode, ultimately obtained by sequentially laminating a sacrificial layer, beam and the like on the substrate side electrode, and the surface of a driving side electrode are flattened. When the driving side electrode is used as a light reflective film, light reflectance on the surface of the driving side electrode is improved.

According to the manufacturing method of an electrostatic drive type MEMS device of the present invention, it is possible to easily and accurately manufacture the MEMS device having a beam, the surface of which is flattened.

An optical MEMS device according to the present invention is composed of a substrate side electrode, a beam that is disposed to oppose the substrate side electrode and has a light reflective film cum driving side electrode driven by electrostatic attraction force or electrostatic repulsion force acting between the substrate side electrode and driving side electrode, with the substrate side electrode being formed of the impurities-doped conductive semiconductor region in the semiconductor substrate.

With the optical MEMS device according to the present invention, since a substrate side electrode is formed of an impurities-doped conductive semiconductor region in the semiconductor substrate, the surface of the semiconductor substrate is maintained as the surface of the substrate side electrode and is maintained as an extremely flattened surface by a mirror finish. Therefore, as described above, the ultimately obtained surface, which reflects light, of a light reflective film cum driving side electrode of a beam is flattened, thereby improving light reflectance as well as light use efficiency.

A light modulation device according to the present invention is composed of a substrate side electrode, a beam that is disposed to oppose the substrate side electrode and has a light reflective film cum driving side electrode driven by electrostatic attraction force or electrostatic repulsion force acting between the substrate side electrode and the driving side electrode, with the substrate side electrode being formed of an impurities-doped conductive semiconductor region in a semiconductor substrate.

With the light modulation device according to the present invention, since a substrate side electrode is formed of an impurities-doped conductive semiconductor region in a semiconductor substrate, the surface of the semiconductor substrate is maintained as the surface of the substrate side electrode and is maintained as an extremely flattened surface by a mirror finish. Therefore, as was described above, the degree of flatness of the ultimately obtained surface, which reflects light, of a light reflective film cum driving side electrode of a beam is remarkably improved, thereby improving light reflectance as well as light use efficiency.

A GLV device according to the present invention is composed of a common substrate side electrode, a plurality of beams that are disposed to oppose the common substrate side electrode and have light reflective film cum driving side electrodes driven by electrostatic attraction force or electrostatic repulsion force acting between the substrate side electrode and the driving side electrodes, with the substrate side electrode being formed of a impurities-doped conductive semiconductor region in the semiconductor substrate.

With the GLV device according to the present invention, since a substrate side electrode is formed of an impurities-doped conductive semiconductor region in a semiconductor substrate, the surface of the semiconductor substrate is maintained as the surface of the substrate side electrode and is maintained as an extremely flattened surface by a mirror finish. Therefore, as described above, the ultimately obtained surface, which reflects light, of a light reflective film cum driving side electrode of a beam is flattened, thereby improving light reflectance as well as light use efficiency.

A laser display according to the present invention includes a laser light source, and a GLV device which is disposed on the optical axis of a laser beam emitted from the laser light source and modulates the strength of laser beams, wherein the GLV device is composed of common substrate side electrodes, and a plurality of beams that are disposed to oppose the common substrate side electrodes and have light reflective film cum driving side electrodes driven by electrostatic attraction force or electrostatic repulsion force acting between the substrate side electrode and the driving side electrodes, with the substrate side electrode being formed of an impurities-doped conductive semiconductor region in a semiconductor substrate.

With the laser display of the present invention, since in a GLV device that modulates the strength of a laser beam a substrate side electrode is formed of an impurities-doped conductive semiconductor region, as described above, the surfaces of light reflective film cum driving side electrodes of a plurality of beams are flattened. Therefore, light reflectance increases, and light use efficiency in the laser display improves.

According to an electrostatic drive type MEMS device of the present invention, since a substrate side electrode is formed of an impurities-doped conductive semiconductor region in a semiconductor substrate, and the surface of the substrate side electrode is maintained as the same flattened surface as the surface of the semiconductor substrate, surface unevenness (roughness) of a driving side electrode of a beam, which has become obvious in the MEMS device, can be extremely reduced and flattened as well. As a result, improvements in the performance of the MEMS device can be obtained. Further, since the substrate side electrode of the MEMS device is formed on the same surface as the surface of the semiconductor substrate, the flatness of an overall chip having the MEMS device is improved, the degree of freedom of packaging that is unique to the MEMS device is increased, the degree of freedom in designing a manufacturing process can be improved, and reduction of costs can be implemented.

According to manufacturing methods of an electrostatic drive type MEMS device of the present invention, it is possible to manufacture the above-mentioned MEMS devices easily and accurately.

When an electrostatic drive type MEMS device of the present invention is applied to an optical MEMS device, since the surface of a light reflective film cum driving side electrode is flattened, light reflectance improves, light use efficiency increases, and improvements in the performance of the MEMS device can be implemented.

When an electrostatic drive type MEMS device of the present invention is applied to a light modulation device that takes advantage of light reflection or light diffraction, since the surface of a light reflective film cum driving side electrode is flattened, light reflectance improves, and it is possible to provide the light modulation device with high light-use efficiency. That is, the light modulation device with improved performance can be provided.

When a GLV device is composed of a light modulation device of the present invention, it is possible to provide the GLV device with high light-use efficiency. That is, the GLV device with improved performance can be provided.

When a GLV device of the present invention is incorporated in a laser display, it is possible to provide the laser display with high light-use efficiency. That is, the laser display with improved performance can be provided.

BEST MODE FOR CARRYING OUT THE INVENTION

Hereinafter, the embodiments of the present invention will be explained with reference to drawings.

Figure 1:
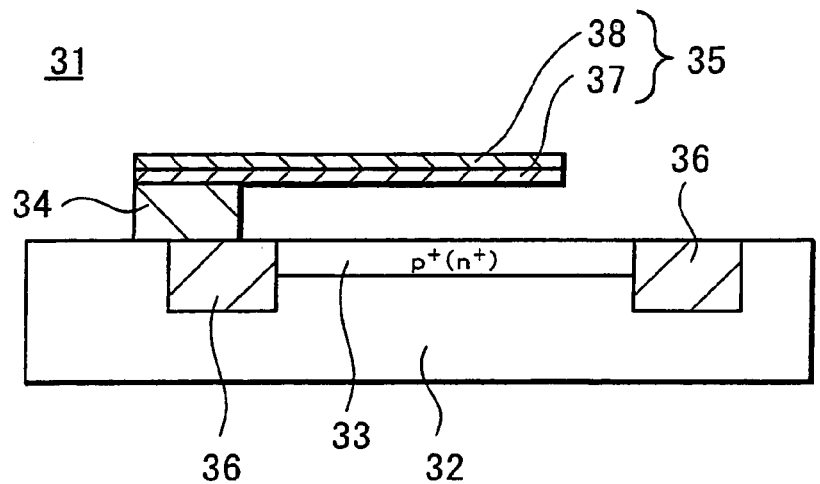
FIG. 1 is a diagram showing a typical embodiment of an electrostatic drive type MEMS device according to the present invention.

FIG. 1 shows one typical embodiment of an electrostatic drive type MEMS device according to the present invention.

A MEMS device 31 according to the present invention is composed by forming a conductive semiconductor region 33 in a predetermined region of one surface of a semiconductor substrate 32 with the required doping of conductive type impurities, and after the conductive semiconductor region 33 is made to be a substrate side electrode, by disposing an electrostatic drive type beam 35, one end of which is supported by an insulative support part 34 so as to oppose the substrate side electrode 33. The beam 35 is composed in a so-called cantilever fashion. Meanwhile, a semiconductor integrated circuit and the like to control the driving is incorporated into a part of the MEMS device 31.

A substrate consisting of, for example, silicon (Si), gallium arsenic (GaAs) or the like can be used as the semiconductor substrate 32. By doping impurities of a p type or n type into the semiconductor substrate 32 by means of the ion implantation method, thermal diffusion method, or solid phase diffusion method, a conductive semiconductor region, that is, the substrate side electrode 33 can be formed. The substrate side electrode 33 is insulated to be isolated from the periphery by an isolating-by-insulation region 36.

Figure 2A:
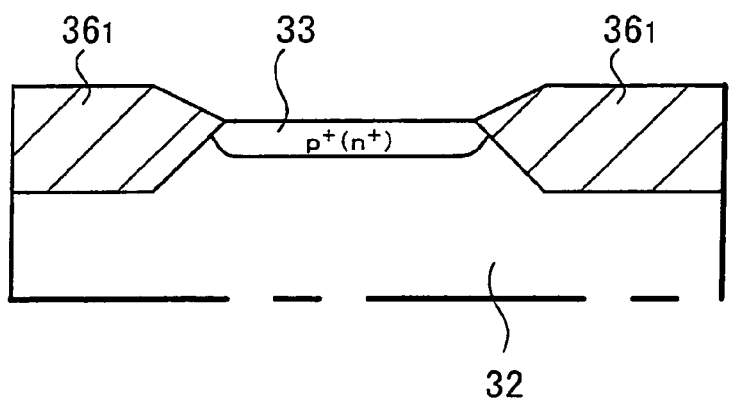
FIG. 2A is one example of a region insulated to be isolated of a substrate side electrode of the electrostatic drive type MEMS device according to the present invention.

As for the isolation by insulating the substrate side electrode 33, as shown in FIG. 2A, a selective oxidation (so-called LOCOS) layer 36, is formed on the surface of, for example, the silicon semiconductor substrate 32, by which the substrate side electrode 33 can be insulated to be isolated.

Figure 2B:
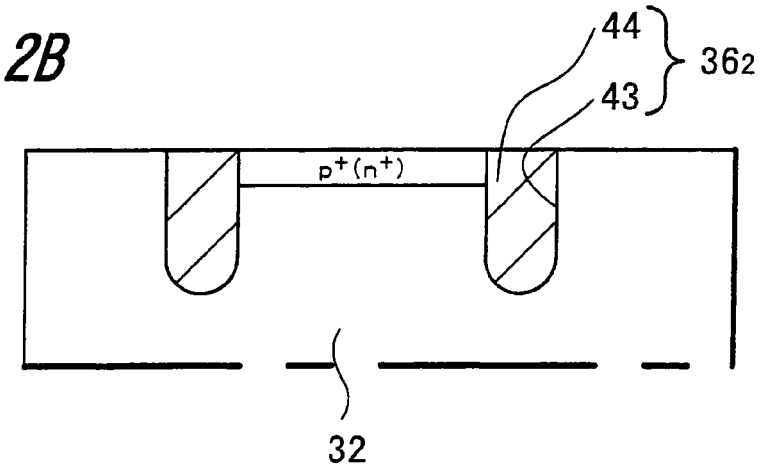
FIG. 2B is another example of the region insulated to be isolated of the substrate side electrode of the electrostatic drive type MEMS device of the present invention.

Alternatively, as shown in FIG. 2B, the substrate side electrode 33 can be insulated to be isolated by trench isolation (STI: Shallow Trench Isolation). Namely, a trench 43 is formed to surround the conductive semiconductor region 33, and the substrate side electrode 33 can be insulated to be isolated by a trench isolation region 362 that is formed by embedding an insulating layer, for example, a silicon oxide layer 44 in the trench 43.

The insulative support part 34 can be formed of an insulating body: such as a silicon nitride (SiN) film or a silicon oxide film ($SiO_2$). A silicon nitride film is used in this embodiment. The beam 35 can be formed of an insulation film, such as a silicon nitride (SiN) film or a silicon oxide film ($SiO_2$), and, in this embodiment, a laminated film of silicon nitride (SiN) 37 is used with a driving side electrode 38 thereon, having physical property values of which such as strength, elastic constant and the like are suitable for mechanically driving the beam. As for the driving side electrode 38, an Ag film, an Al film mainly consisting of aluminum (Al), a refractory metal film formed of any one of titanium (Ti), tungsten W, molybdenum Mo, tantalum Ta or the like can be employed.

FIGS. 6 and 7 show one embodiment of the manufacturing method of the above-mentioned electrostatic drive type MEMS device 31.

Figure 6A:
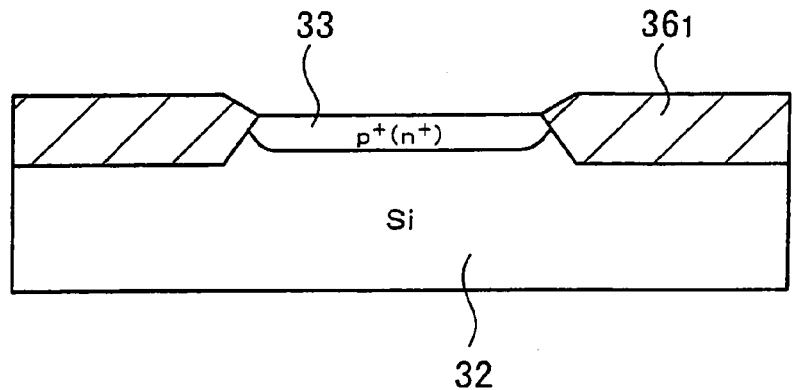
FIGS. 6A to 6C are diagrams showing one embodiment of a manufacturing process (first sequence) of a manufacturing method of the electrostatic drive type MEMS device of FIG. 1.

First, as shown in FIG. 6A, the insulation layer 36, is formed in a predetermined region on one surface of a semiconductor substrate, for example, silicon mono-crystalline substrate 32 through selective oxidation (LOCOS), and impurities of a p type or n type are doped in a region surrounded by the insulation layer 36, to form the conductive semiconductor region (so-called impurities diffused region) 33. The conductive semiconductor region 33 becomes a substrate side electrode.

As the method for doping impurities to form the conductive semiconductor region 33, the ion injecting method, thermal diffusion method, solid phase diffusion method and the like can be implemented. In the case of the ion injecting method, accelerated phosphor, boron, arsenic or the like is doped in the silicon substrate 32, and heat treatment is applied thereto so as to restore the crystallinity of the silicon substrate 32. With the thermal diffusion method, at the time when phosphor is being doped, heat treatment is performed in an atmosphere of $CL_3PO$ gas. With the solid phase diffusion method, a boron silicate glass (BSG) film in which, for example, phosphor is doped, a phosphor silicate glass (PSG) film in which boron is doped or the like is laminated on the silicon substrate 32, and after heat treatment is applied thereto, followed by solid phase diffusion, impurities such as boron or phosphor are doped therein.

Figure 6B:
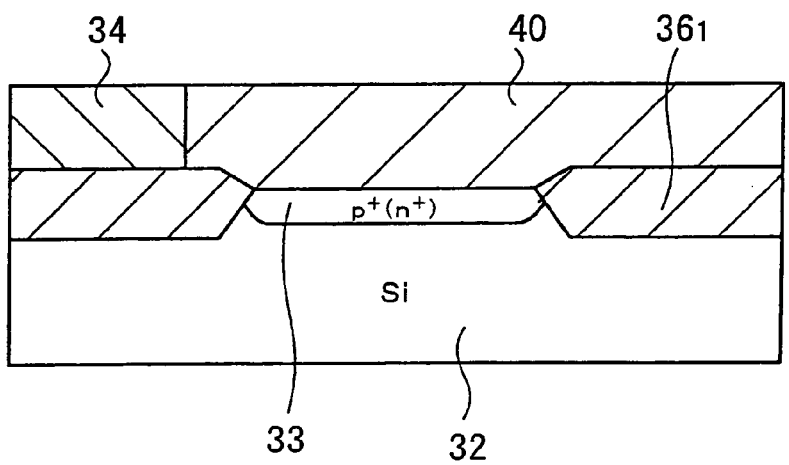

Next, as shown in FIG. 6B, an insulation film serving as a columnar support part, in this embodiment, a silicon nitride film is formed on the upper surface of the silicon substrate 32 with the CVD method or the like, and patterning is performed thereto to form the columnar support part 34 formed of a silicon nitride film at a position detached from the substrate side electrode 33. Next, a sacrificial layer for forming a void, in this embodiment, polycrystalline silicon film 40 is formed on the whole surface, followed by etching the polycrystalline silicon layer 40 so that the surface becomes flush with the surface of the columnar support part 34. In addition, other than the polycrystalline film, a non-crystalline silicon film, a photoresist film or an insulation film (for example, silicon oxide film, silicon nitride film or the like) that has an etching rate different from that of the insulation film constituting the columnar support part 34 and beam can be used as the sacrificial layer 40.

Figure 6C:
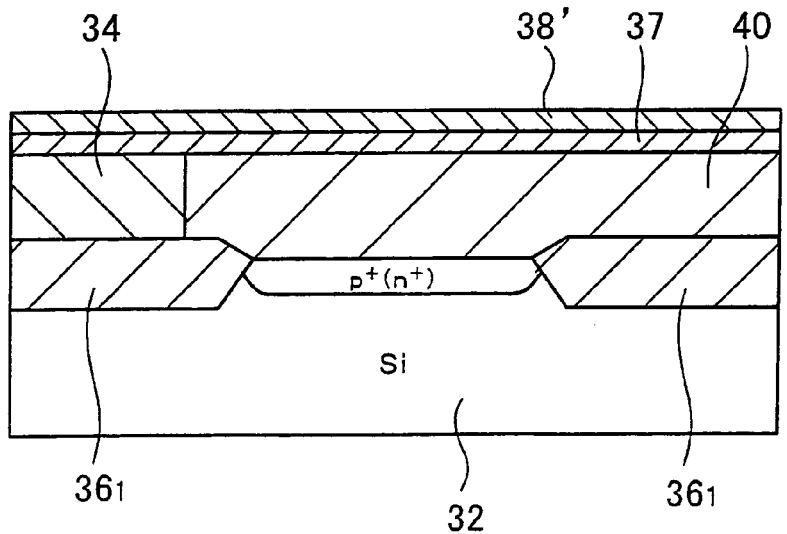

Next, as shown in FIG. 6C, an insulation film, for example, such as a silicon nitride film, silicon oxide film or the like, in this embodiment, a silicon nitride film 37, and a driving side electrode material layer 38' thereupon are sequentially laminated on the overall surface that includes the upper surface of the columnar support part 34 and polycrystalline silicon layer 40.

Figure 7A:
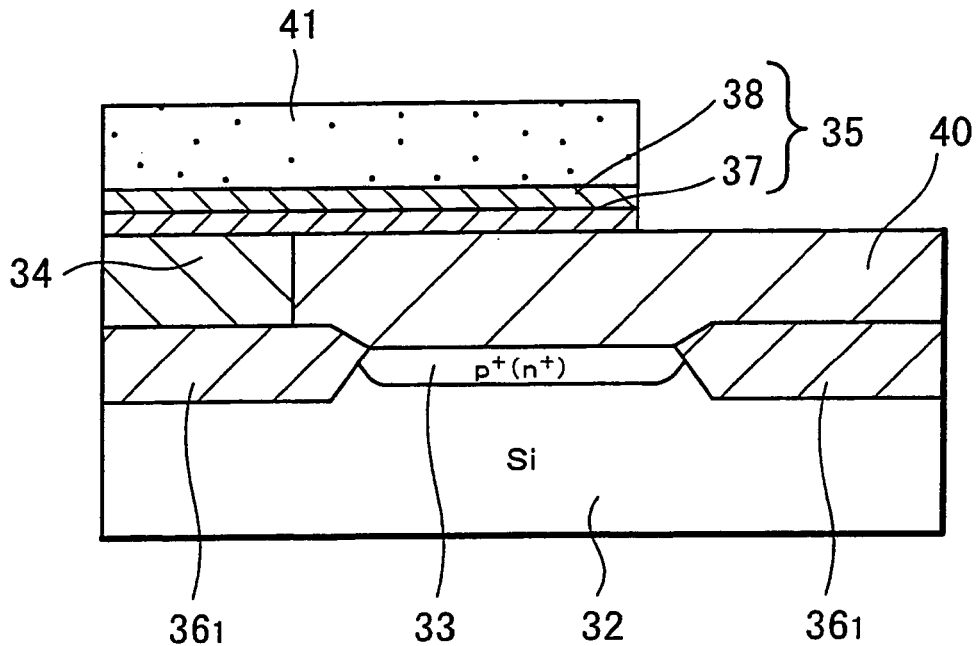
FIGS. 7A and 7B are diagrams showing one embodiment of a manufacturing process (second sequence) of the manufacturing method of the electrostatic drive type MEMS device of FIG. 1.

Next, as shown in FIG. 7A, a resist mask 41 is formed, followed by selectively removing a driving side electrode material layer 38' and the silicon nitride film 37 thereunder by etching through the resist mask 41 so as to form the beam 35 that is composed of the driving side electrode 38 and silicon nitride film 37, which is supported by the columnar support part 34.

Figure 7B:
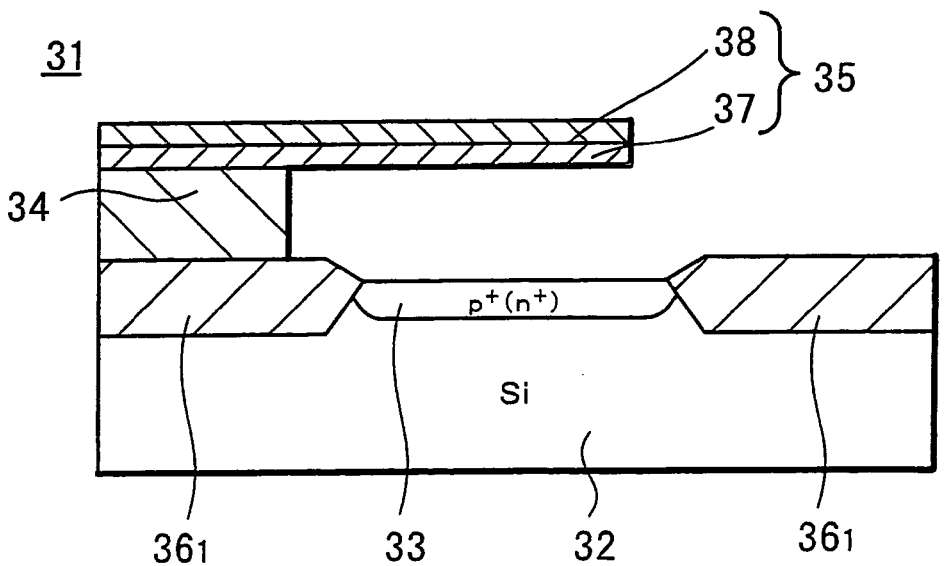

Next, as shown in FIG. 7B, the polycrystalline silicon layer 40 constituting the sacrificial layer is removed by etching with, for example, a $XeF_2$ gas to form a void 40 between the substrate side electrode 33 and beam 35 to resultantly obtain the targeted electrostatic drive type MEMS device 31.

Figure 8A:
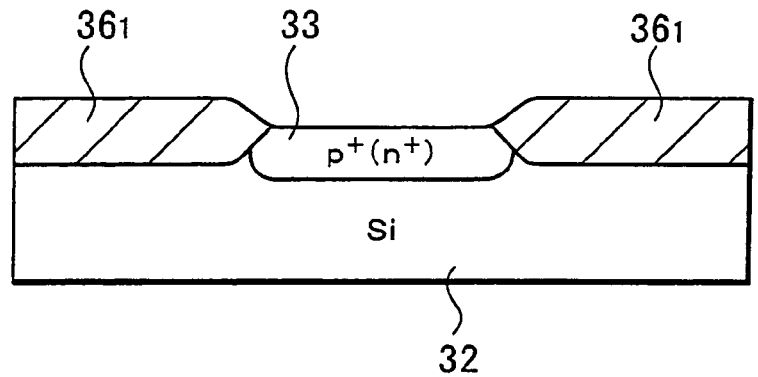
FIGS. 8A to 8C are diagrams showing another embodiment of a manufacturing process (first sequence) of the manufacturing method of the electrostatic drive type MEMS device of FIG. 1.

FIGS. 8 and 9 show another embodiment of the manufacturing method of the above-mentioned electrostatic drive type MEMS device 31.

First, similarly to FIG. 6A mentioned above, as shown in FIG. 8A, the insulation layer 36, is formed by selective oxidation (LOCOS) in a predetermined region on one surface of a semiconductor substrate, for example, the silicon mono-crystalline substrate 32, followed by doping impurities of a p type or n type in the region surrounded by the insulation layer 36, to form the conductive semiconductor region (so-called impurities diffused region) 33. The conductive semiconductor region 33 becomes a substrate side electrode.

Figure 8B:
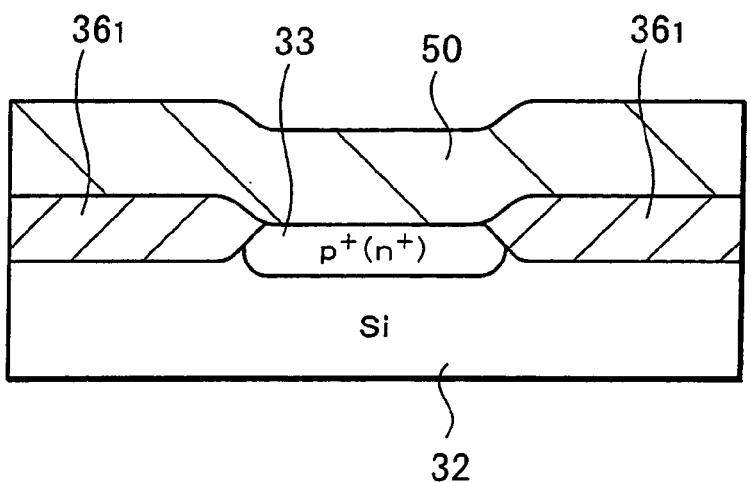

Next, as shown in FIG. 8B, a sacrificial layer, for example, a polycrystalline silicon film 50 is laminated over the overall surface of this substrate, that is, the substrate 32 in which impurities diffused region 33 are partly formed.

Figure 8C:
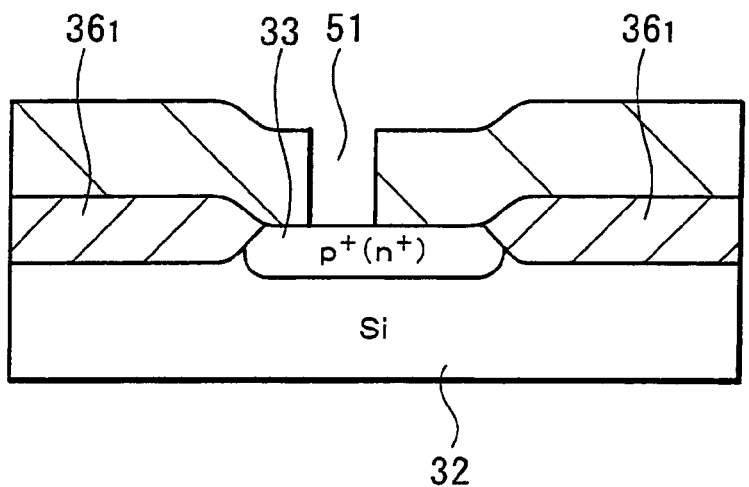

Next, as shown in FIG. 8C, an opening 51 serving as a post (columnar support part) to support the beam is formed in a region of the polycrystalline silicon film 50.

Figure 9A:
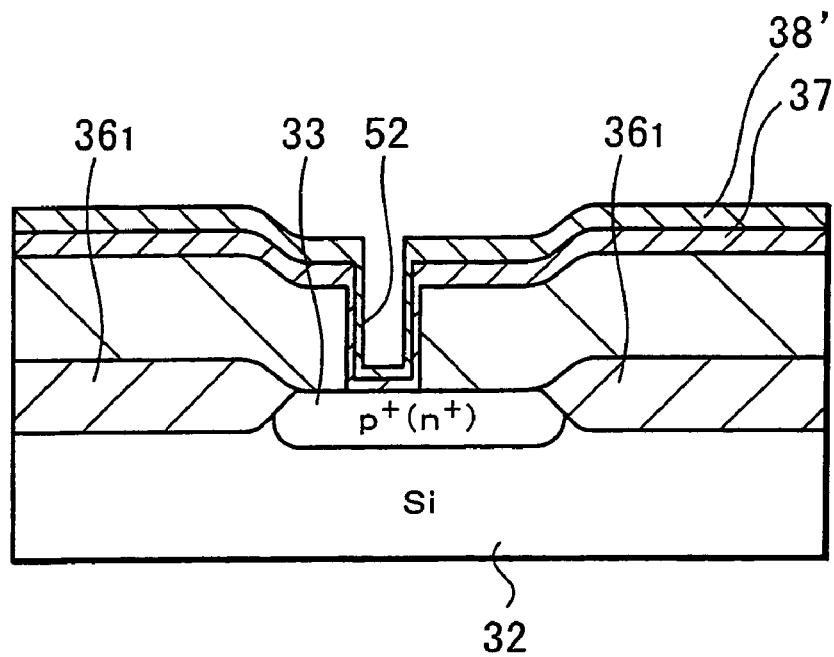
FIGS. 9A and 9B are diagrams showing another embodiment of a manufacturing process (second sequence) of the manufacturing method of the electrostatic drive type MEMS device of FIG. 1.

Next, as shown in FIG. 9A, a laminated film of, for example, the SiN film 37 and Al film 38' which serves as the beam is formed on the polycrystalline silicon film 50 constituting the sacrificial layer, including the inside of the opening 51. The two-layer film (37, 38') of Al/SiN that is formed on the side walls of the opening 51 becomes a post to support the beam 52, which is a cylinder or square column in shape with its core hollowed out.

Figure 9B:
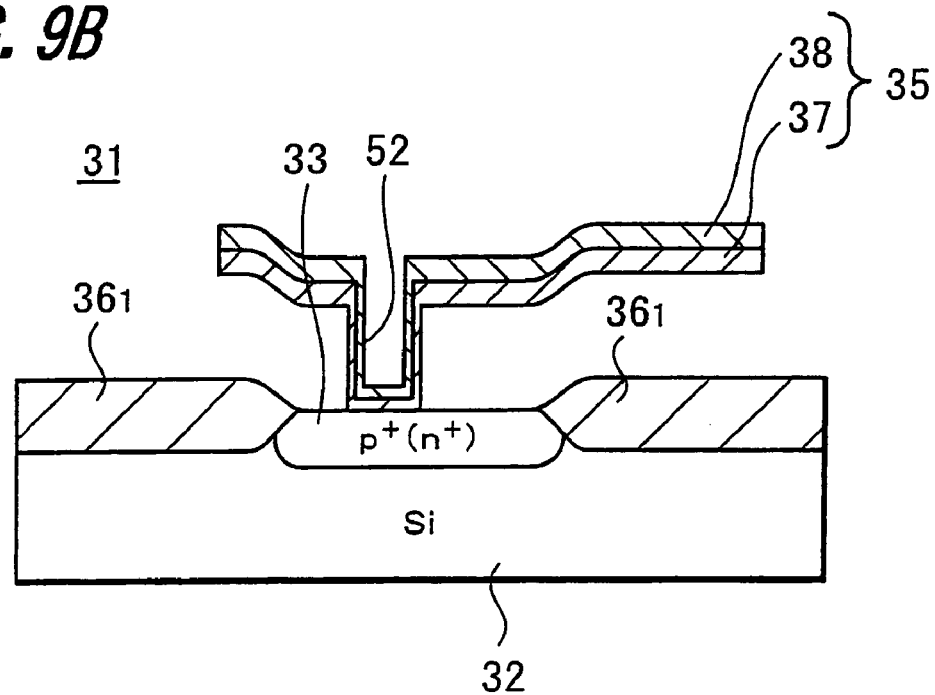

Finally, as shown in FIG. 9B, the Al/SiN laminated film (37, 38') is processed to form a predetermined pattern, and the beam 35 composed of the SiN film 37 and driving side electrode 38 consisting of Al is formed, with the result that the targeted MEMS device 31 is obtained. In FIG. 9B, since the beam 35 is elongated toward one direction from the post 52, the MEMS structured in a cantilever beam fashion can be obtained.

Figure 5:
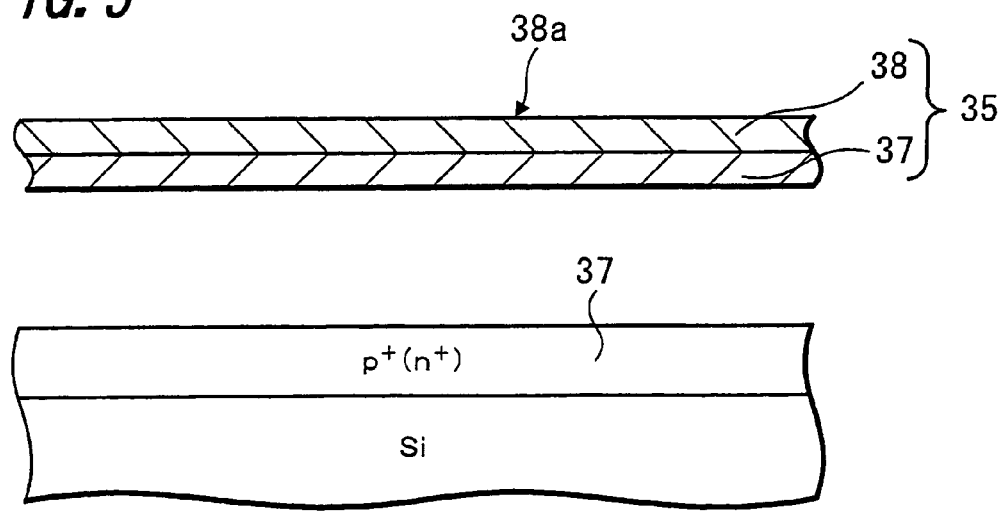
FIG. 5 is a cross-sectional view of a relevant part of a driving side electrode of the electrostatic drive type MEMS device according to the present invention.
Figure 16:
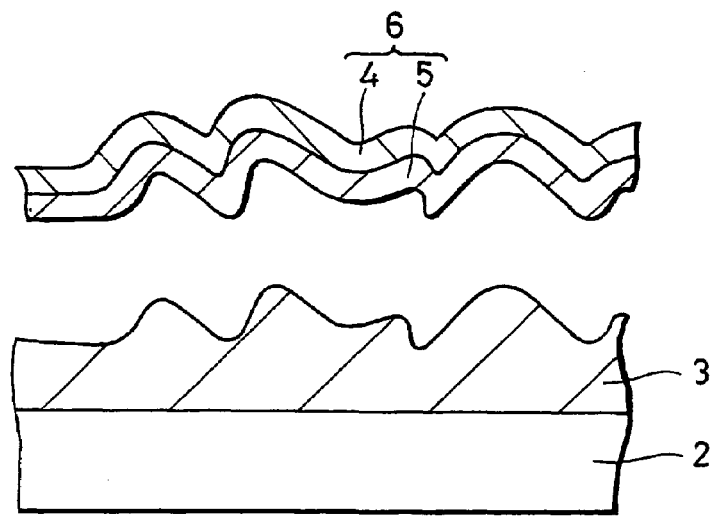
FIG. 16 is a cross-sectional view of a relevant part showing unevenness of a driving side electrode of a conventional optical MEMS device.
Figure 17A:
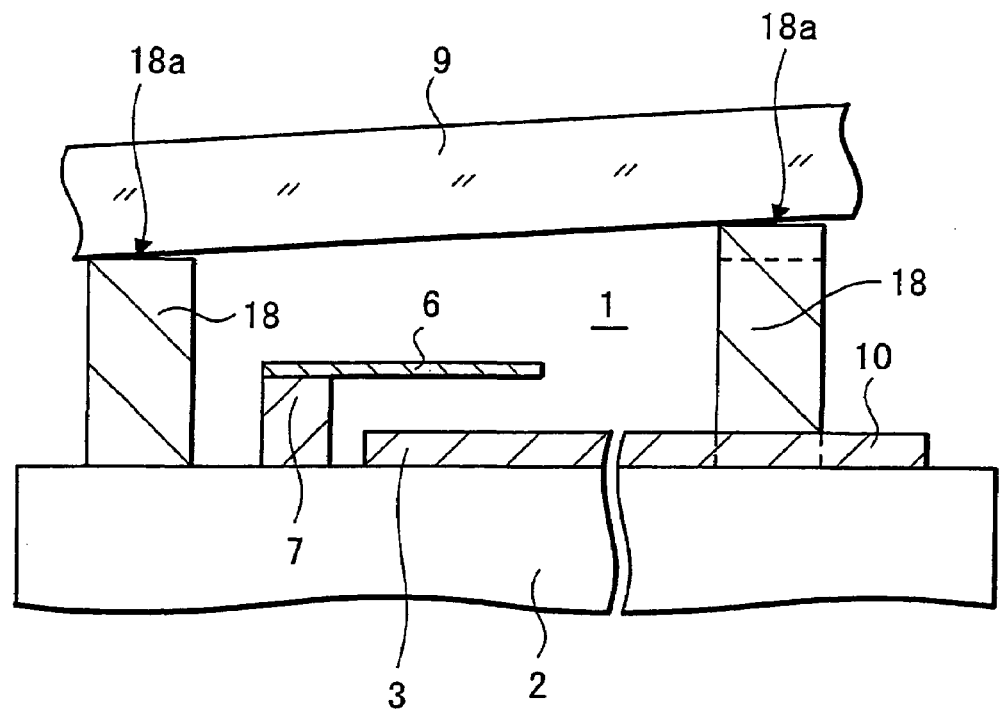
FIG. 17A is a structural diagram of a relevant part of a package of a conventional MEMS device.
Figure 17B:
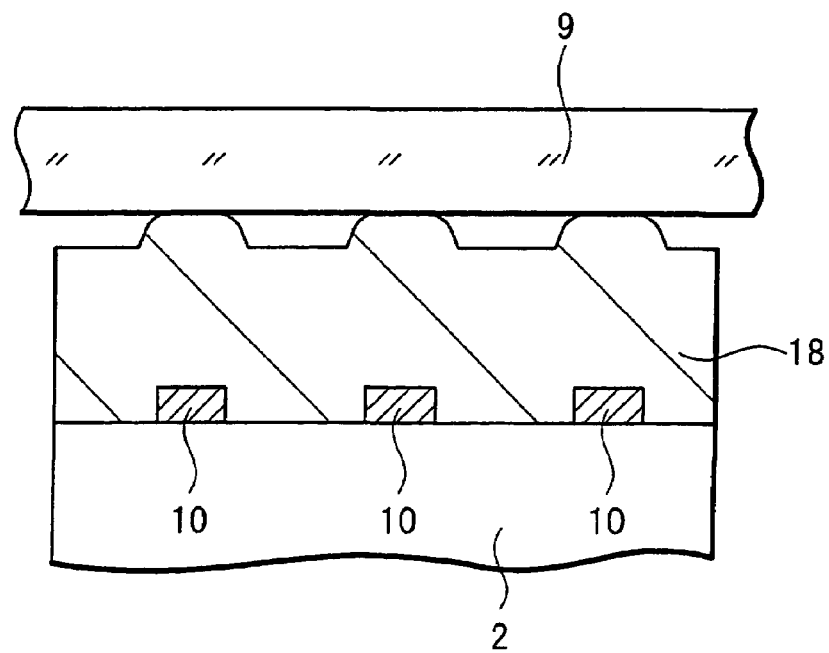
FIG. 17B is a structural diagram of the relevant part of FIG. 17A seen at an angle of 90° thereof.

According to the manufacturing method of the MEMS device 31 of this embodiment, since the substrate side electrode 33 is formed within the conductive semiconductor region (impurities diffused region) formed on one surface of the silicon mono-crystalline substrate 32, the silicon mono-crystalline substrate 32 is maintained as the surface of the substrate side electrode 33 so that the surface thereof is maintained as an extremely flat surface with a polished mirror finish. Therefore, in the manufacturing process, when the sacrificial layer 40, and the SiN film 37 and driving side electrode 38 constituting beam 35 are sequentially laminated on the substrate side electrode 33, the unevenness of layers underlaid shown in FIG. 16 as mentioned above is not reflected, so that an upper surface 38a of the driving side electrode 38 of the beam 35 and the bottom surface of the insulation film 37 of the beam 35 opposing the substrate side electrode 33 can be flattened. Particularly, a surface only affected by unevenness due to crystal grains of the film composing the driving side electrode 38 is obtained as the upper surface 38a. When, for example, the driving side electrode 38 is formed of an Al film, the upper surface of the Al film is only affected by the unevenness of crystal grains of the Al film. As a result, as shown in FIG. 5, the driving side electrode 38 with excellent flatness is obtained.

When the MEMS device 31 is applied to an optical MEMS device, the upper surface 38a of the driving side electrode 38 becomes a flattened light reflective surface (so-called mirror surface), which improves light reflectance and increases the light use efficiency of reflected light, making it possible to implement improvements in the performance of the optical devices such as a light switch capable of controlling on-off, the light modulation device for modulating the strength of light, and the like.

According to the manufacturing method of the MEMS device according to this embodiment, since the substrate side electrode 33 is formed of the impurities diffused region formed by doping impurities in the semiconductor substrate 32, the surface of the mono-crystalline substrate 32 is maintained as the surface of the substrate side electrode 33, resulting in a flat surface having a polished mirror finish. Subsequently, the sacrificial layer 40 or 50, insulation layer 37 and driving side electrode material layer 38' are sequentially laminated, followed by removing the sacrificial layer 40 or 50. As a result, it becomes possible to precisely and easily manufacture the MEMS device 31 having the beam 35 in which the driving side electrode 38 is flattened.

Figure 3:
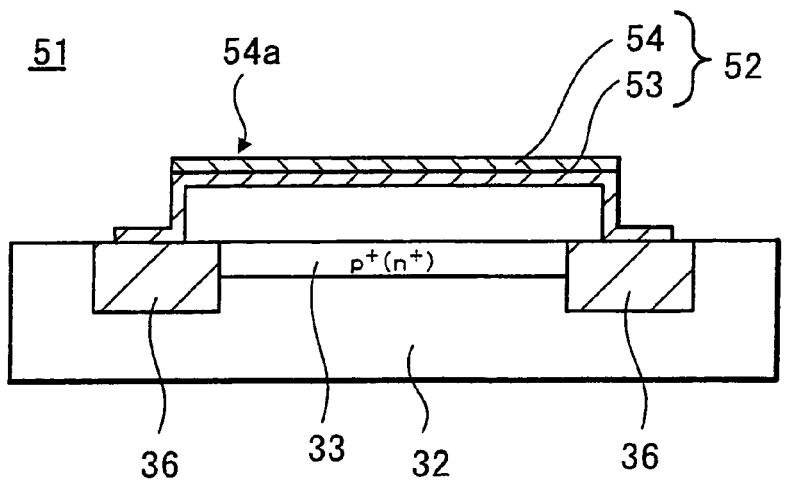
FIG. 3 is a diagram showing another typical embodiment of the electrostatic drive type MEMS device according to the present invention.

FIG. 3 shows another typical embodiment of the electrostatic drive type MEMS device according to the present invention. This embodiment shows the case in which the beam is formed in a bridge-like fashion.

A MEMS device 51 according to the embodiment is composed such that the conductive semiconductor region 33 is formed by doping impurities of a required conductive type in a predetermined region of one surface of the semiconductor substrate 32, and with the conductive semiconductor region 33 serving as a substrate side electrode, a beam 52 of an electrostatic drive type is disposed to oppose the substrate side electrode 33 so as to straddle the substrate side electrode 33 in a bridge-like fashion. The substrate side electrode 33 is insulated to be isolated from the periphery by the isolating-by-insulation region 36 such as the insulation layer 36, by the use of selective oxidation, the trench isolation region 362 or the like, respectively shown in FIGS. 2A, 2B as mentioned above.

The beam 52 is composed of an insulation film rising up from the substrate 32 so as to straddle the substrate side electrode 33 in a bridge-like fashion, for example, bridge member 53 of, for example, silicon nitride (SiN) film, and a driving side electrode 54 provided on the bridge member 53, which opposes the substrate side electrode 33, to be parallel to each other.

Since the semiconductor substrate 32, substrate side electrode 33, the insulation film 53 and driving side electrode 54 composing beam 52, and the like can employ the same composition and materials explained in FIG. 1, detailed explanations will be omitted.

The MEMS device 51 can be manufactured by the same processes as explained above in FIGS. 6 and 7.

Namely, after the substrate side electrode 33 composed of the conductive semiconductor region (impurities diffused region) is formed by doping impurities onto the surface of the region surrounded by the isolating-by-insulation region 36 of the semiconductor substrate 32, the sacrificial layer is formed selectively, including the upper part of the substrate side electrode 33; followed by forming the bridge-like insulation film 53, including an upper part of the sacrificial layer and that of the substrate where the isolated-by-insulation region is formed, and by forming the driving side electrode 54 on the surface, which is in parallel to the substrate side electrode 33, of the bridge-like insulation film 53, to thereby form the beam 52, and thereafter, by removing the sacrificial layer, the MEMS device 51 can be manufactured.

As with the electrostatic driving type MEMS device 51 according to this embodiment, the same as was mentioned above, since the substrate side electrode 33 is composed of the conductive semiconductor region (impurities diffused region) formed on one surface of the silicon mono-crystalline substrate 32, the unevenness of the surfaces underlaid is not reflected onto an upper surface 54a of the driving side electrode 54 of the beam 52, which becomes the surface which is only affected by the unevenness due to crystal grains of a film composing the driving side electrode 54 and is, therefore, flattened. Therefore, when the electrostatic driving type MEMS device 51 is applied to an optical MEMS device, the upper surface 54a of the driving side electrode 54 becomes a more flattened mirror surface to improve light reflectance and increase reflected light use efficiency, thereby enabling the performance of the light switch, light modulation device and the like as optical devices to be improved.

Figure 4:
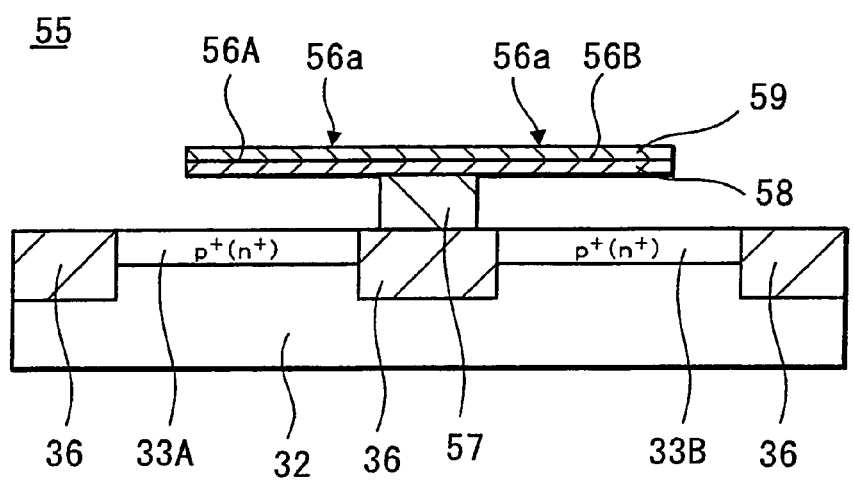
FIG. 4 is a diagram showing a further typical embodiment of the electrostatic drive type MEMS device according to the present invention.

FIG. 4 shows another typical embodiment of the electrostatic drive type MEMS device according to the present invention.

A MEMS device 55 according to the present invention is composed such that impurities of a required conductive type are doped in a predetermined region of one surface of the semiconductor substrate 32, for example, two regions opposing across the center thereof to form conductive semiconductor regions 33 [33A, 33B], and by the conductive semiconductor regions 33A, 33B each being made to be substrate side electrodes, beams 56 [56A, 56B] are disposed so as to oppose both substrate side electrodes 33A, 33B, respectively. The beams 56A, 56B are formed of a common beam, and composed of parts that extend in the right and left directions from the central part of the beams, which are supported by a support part 57. The substrate side electrodes 33A, 33B are insulated to be isolated from the periphery by the same isolating-by-insulation region 36 mentioned above. The beam 56 is formed of a laminated film of an insulation film, for example, a silicon nitride (SiN) film 58 and a driving side electrode 59 thereupon.

Since the semiconductor substrate 32, the substrate side electrodes 33 [33A, 33B], the insulation film 58 composing the beams 56 [56A, 56B], the driving side electrode 59 and the like can employ the same composition and materials as explained above in FIG. 1, detailed explanations will be omitted.

Further, though the substrate side electrodes 33A, 33B are formed independently, there can be a composition in which the beams 56A, 56B are disposed so as to oppose the substrate side electrode 33 as the one common substrate side electrode 33.

The MEMS device 55 can be manufactured by the same processes as explained above in FIGS. 6 and 7.

Namely, the MEMS device 55 can be manufactured such that the substrate side electrodes 33 [33A, 33B] composed of the conductive semiconductor regions (impurities diffused regions) are formed by doping impurities onto the surface of the region surrounded by the isolating-by-insulation region 36 of the semiconductor substrate 32, and after selectively forming in a central part the support part 57 composed of an insulation film, a sacrificial layer is selectively formed including the upper part of the substrate side electrodes 33 [33A, 33B], followed by forming the insulation film 58 and driving side electrode 59 including the upper surfaces of the support part 57 and sacrificial layer to thereby form the beams 56 [56A, 56B], and thereafter, the sacrificial layer is removed to obtain the MEMS device 55.

As with the electrostatic driving type MEMS device 55, the same as was mentioned above, since the substrate side electrodes 33 [33A, 33B] are composed of the conductive semiconductor regions (impurities diffused regions) formed on one surface of the silicon mono-crystalline substrate 32, the unevenness of the surfaces underlaid is not reflected onto the surface of the driving side electrode 59 of the beams 56 [56A, 56B], which becomes a surface that is only affected by the unevenness due to crystal grains of a film composing the driving side electrode 59 and is, thereby, flattened. Therefore, when the electrostatic driving side type MEMS device 55 is applied to the optical MEMS device, the upper surface 56a of the driving side electrode 56 becomes a more flattened mirror surface to thereby improve light reflectance and increase reflected light use efficiency, enabling the improved performance of the light switch, light modulation device and the like as optical devices.

The above-mentioned MEMS devices 31, 51, 55 can be applied to an optical MEMS device that takes advantage of light reflection, and an optical MEMS device that takes advantage of light diffraction. In the case of taking advantage of the light reflection, it is possible to employ a composition wherein one beam 35, 52 or 56 is disposed so as to oppose the substrate side electrode 33, or a composition wherein a plurality of beams 35 each drive independently so as to oppose the common substrate side electrode 33. In the case of taking advantage of the light diffraction, the optical MEMS device is composed of a plurality of beams 35, 52 or 56 disposed in parallel.

It is possible to compose a light modulation device by the use of the above-mentioned optical MEMS device.

According to the light modulation device of the embodiments, since reflection efficiency and diffraction efficiency improve, reflected-light using ratios is improved and characteristics and performance as the light modulation device can be improved.

Figure 10A:
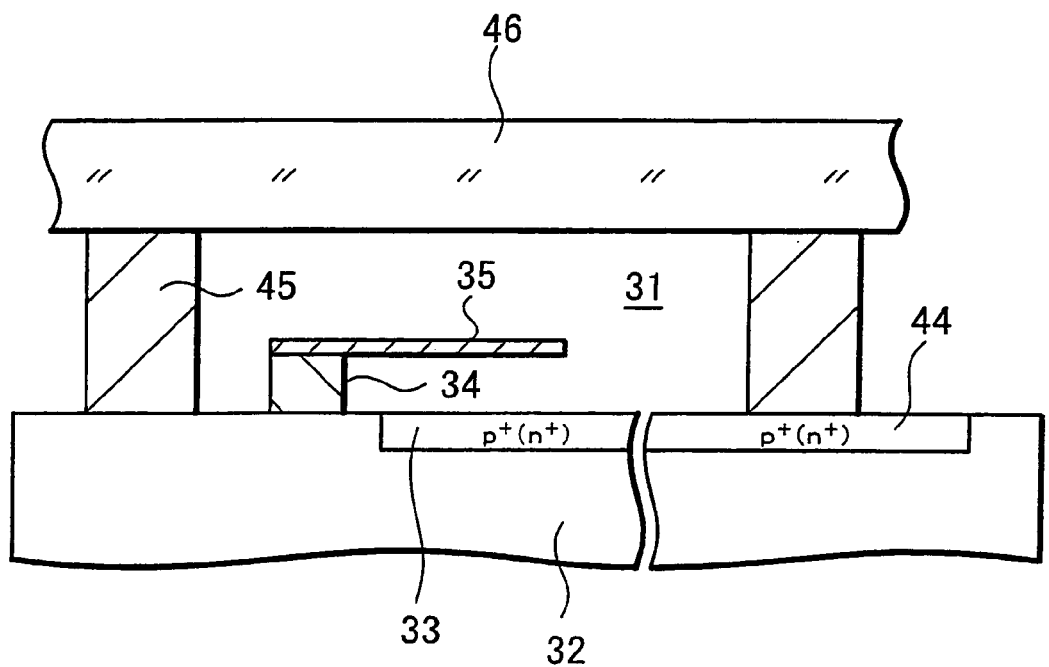
FIG. 10A is a structural diagram of a relevant part of a package of the MEMS device.
Figure 10B:
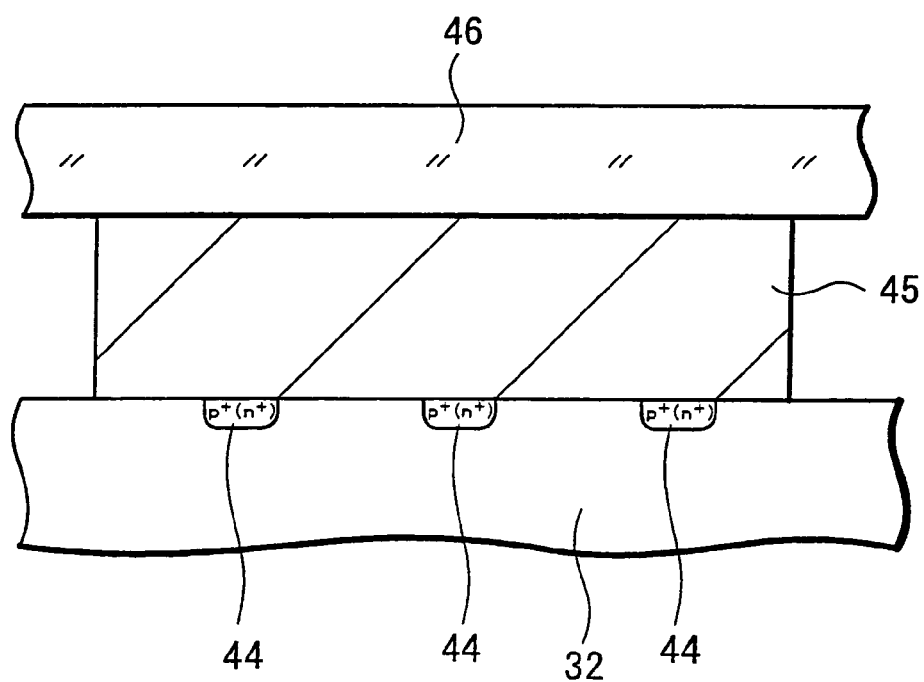
FIG. 10B is a structural diagram of a relevant part of FIG. 8A seen from the direction at an angle of 90° thereof.

FIGS. 10A and 10B show the composition of a package for protecting the MEMS device.

According to this embodiment, the substrate side electrode 33 is composed of the conductive semiconductor region that is formed by doping impurities in the semiconductor substrate 32, and at the same time, a power supplying wiring 44 for driving the MEMS device 31 is also composed of the conductive semiconductor region that is formed by doping impurities in the same semiconductor substrate 32 as in the case of the substrate side electrode 33. Columnar support parts 45 are formed so as to surround the MEMS device 31 (specifically, beam 35, driving body part including substrate side electrode 33) of, for example, a $SiO_2$ layer on the substrate 32. Although a part of the columnar support part 45 is formed so as to creep over the wiring 44, the surface of the columnar support part 45 is formed into a flat surface across the overall surface thereof without stepped differences, because the substrate side electrode 33 is composed of the conductive semiconductor region (impurities diffused region) in the semiconductor substrate 32. Further, there is no unevenness on the surface of the wiring 44, so that the unevenness on the surface of the conventional wiring is not transcribed onto the surface of the columnar support part 45. A glass substrate 46 of a package member is placed upon the columnar support part 45, and the columnar support part 45 and the glass substrate 46 are joined and sealed by means of, for example, the anode bonding method.

With the packaging of the embodiment, since there is no stepped difference on the surface of the columnar support part 45 and no unevenness generated thereupon, and then the overall surface of the columnar support part 45 is flattened, the glass substrate 46 can be placed in close contact with the columnar support part 45, thereby enabling the both to be joined and sealed by means of anode bonding. That is, since the degree of the overall flatness of a chip having the MEMS device is improved, the degree of freedom with respect to designing the packaging unique to the MEMS device increases, and the improvements in the manufacturing process of the MEMS device and the reduction of costs can be implemented.

Figure 11A:
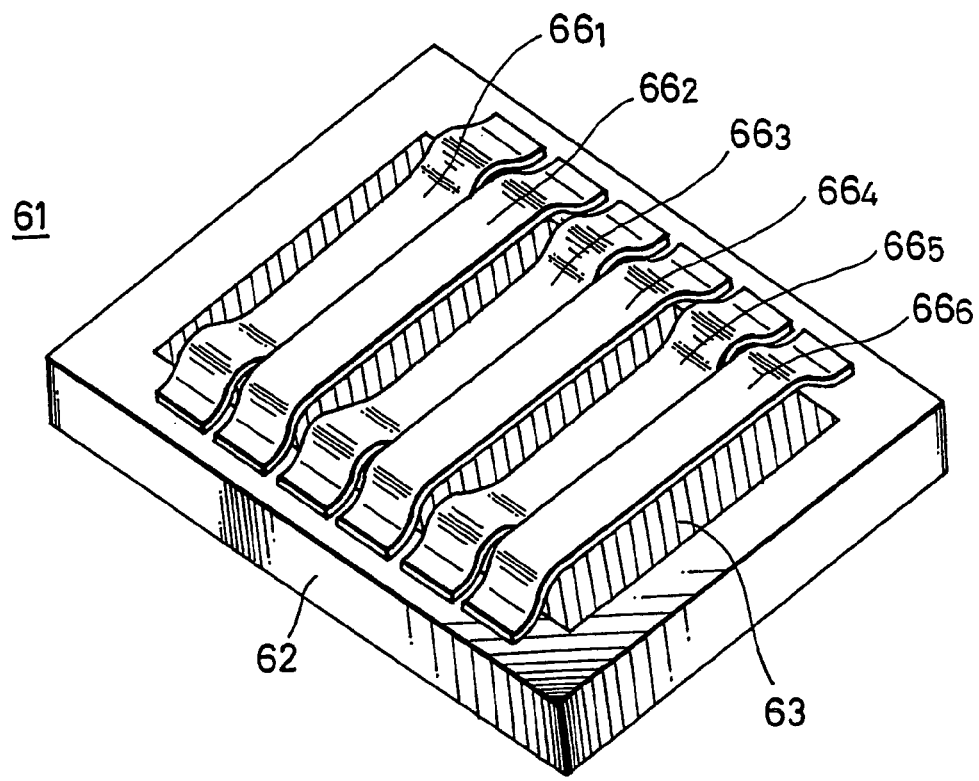
FIG. 11A is a structural diagram showing an embodiment of a GLV device according to the present invention.
Figure 11B:
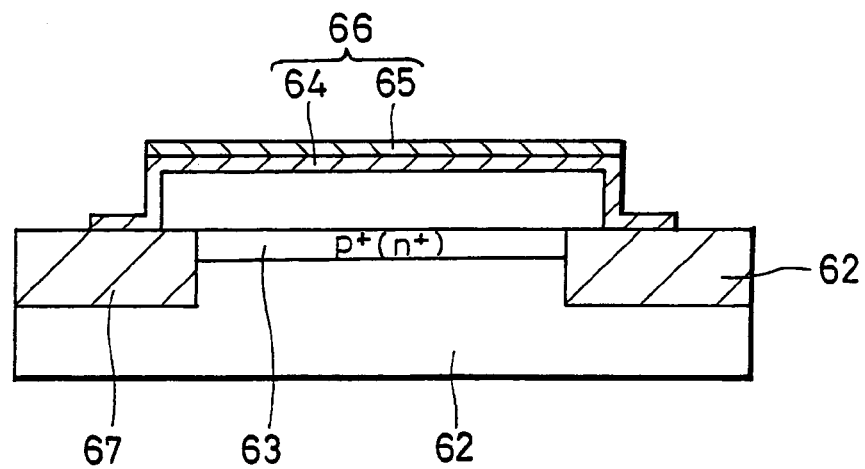
FIG. 11B is a cross-sectional view of FIG. 11A.

FIGS. 11A and 11B show an embodiment of a GLV device according to the present invention.

As explained in the above-mentioned FIG. 3, a GLV device 61 according to the embodiments of the present invention is composed in such a manner that a plurality of, in this embodiment, six beams 66 [$66_1$, $66_2$, $66_3$, $66_4$, $66_5$, $66_6$] composed of a laminated film of a bridge member 64 and driving side electrode 65 are disposed in parallel so as to oppose the common substrate side electrode 63 composed of the conductive semiconductor region (impurities diffused region) that is formed by doping the impurities onto one surface of a semiconductor substrate, for example, the silicon mono-crystalline substrate 62.

As mentioned above, the GLV device 61 alternately varies the height of the driving side electrodes 65 serving as a light reflective film by the movements of every other beams 66, such as moving closer to or moving away from the substrate side electrode 63, and modulates the strength of light reflected on the driving side electrode 65 according to light diffraction.

Since the GLV device 61 according to the embodiment is composed of the conductive semiconductor region (impurities diffused region) by forming the substrate side electrode 63 onto one surface of the semiconductor substrate 62, it is possible to resultantly improve the light reflectance of the mirror surface of the driving side electrodes 65 serving as a reflective film of the beams 66, and to provide the GLV device with high light-use efficiency and high performance.

Figure 12:
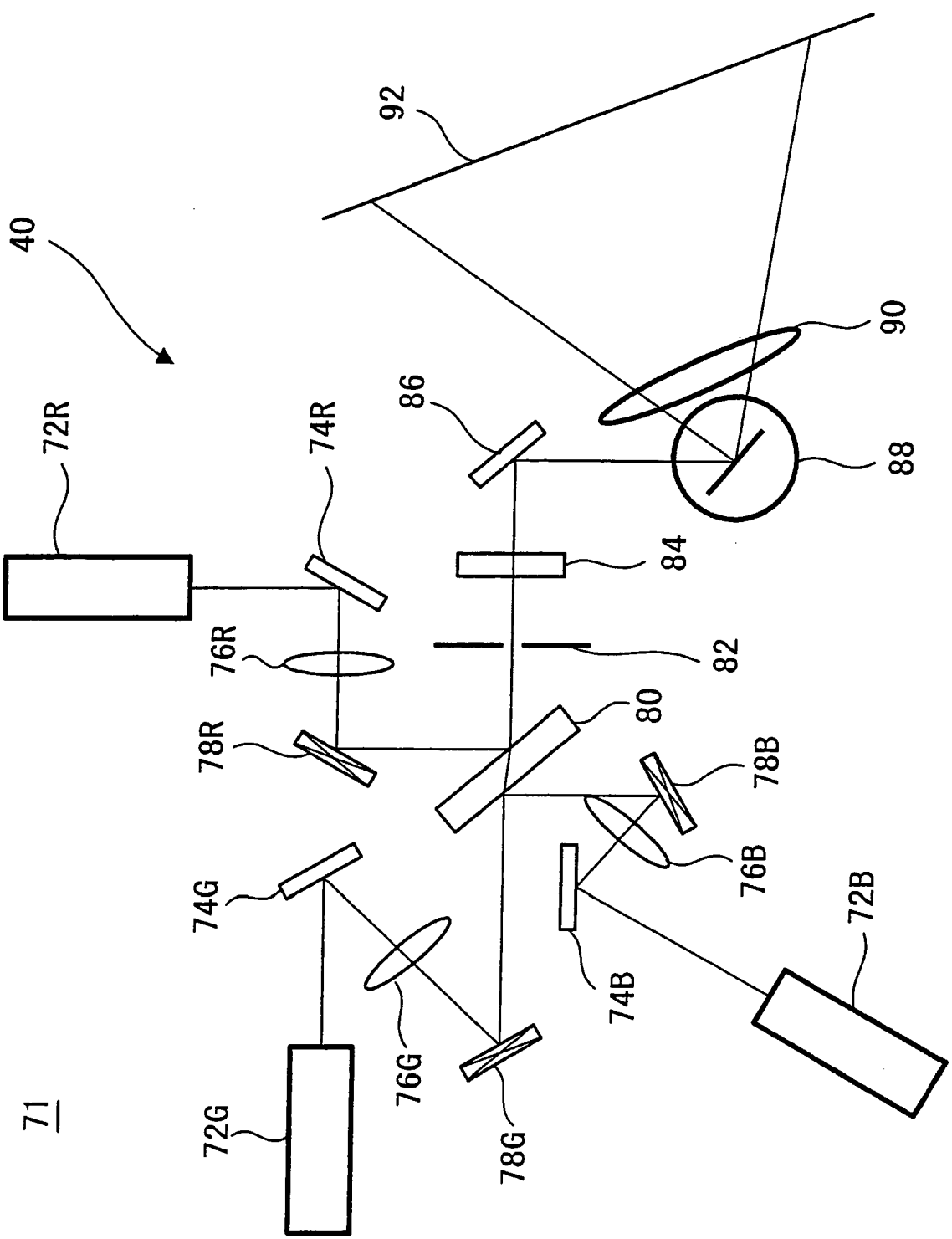
FIG. 12 is a block diagram showing an embodiment of a laser display according to the present invention.
Figure 13:
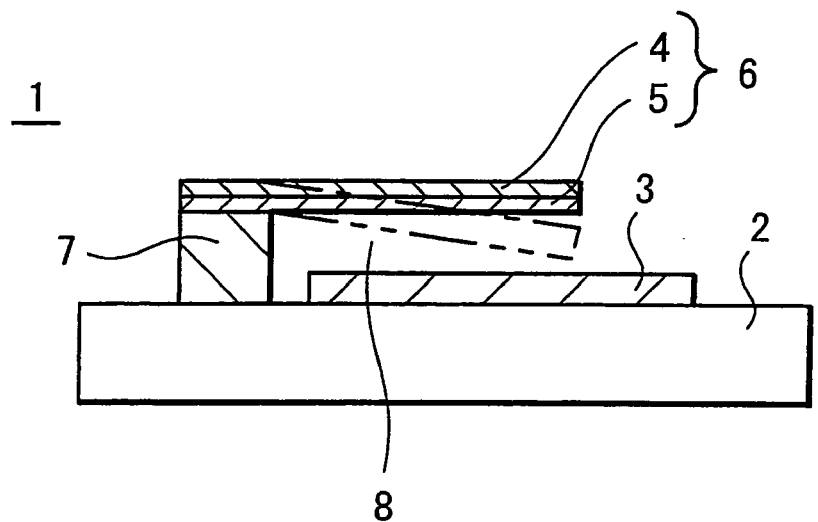
FIG. 13 is one typical example of an optical MEMS device offered for explaining a conventional one.
Figure 14:
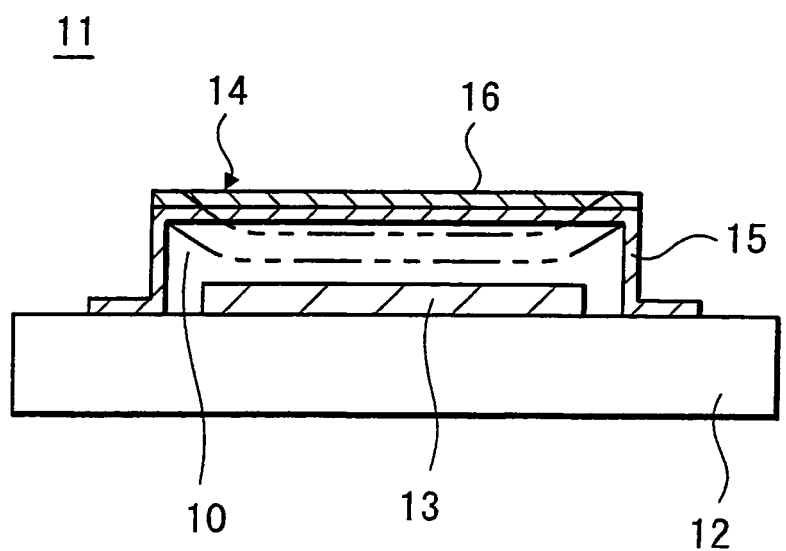
FIG. 14 is another typical example of the optical MEMS device offered for explaining a conventional one.
Figure 15A:
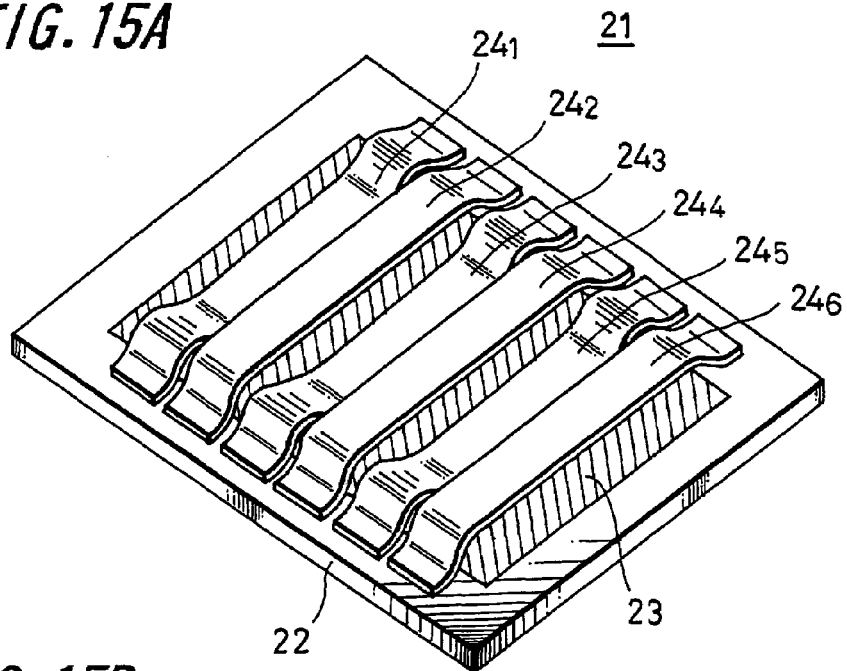
FIG. 15, consisting of FIGS. 15A and 15B, is a structural diagram showing a conventional GLV device.
Figure 15B:
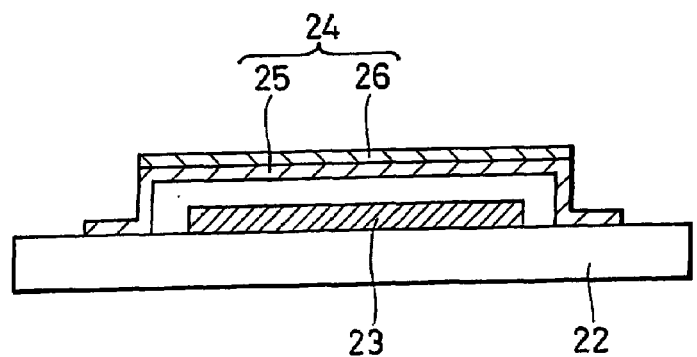

FIG. 12 shows one embodiment of an optical appliance using the GLV device as a light modulation device, to which the above-mentioned MEMS device is applied. This embodiment is the case in which the GLV device is applied to a laser display.

A laser display 71 according to the embodiment is used as, for example, a projector for large-scaled screen, particularly, a projector of digital images, or an appliance for projecting computer images.

The laser display 71 is equipped with, as shown in FIG. 12, the laser beam sources of 72R, 72G, 72B of respective colors of red (R), green (G), blue (B); mirrors 74R, 74G, 74B sequentially provided respectively on the optical axis of each laser beam source; respective illumination optical systems (a group of lenses) 76R, 76G, 76B; and GLV devices 78R, 78G, 78B functioning as a light modulation device.

The laser beam sources of 72R, 72G, 72B respectively emit laser beams of, for example, R (wavelength 642 nm, light output about 3 W), G (wavelength 532 nm, light output about 2 W), B (wavelength 457 nm, light output about 1.5 W).

Further, the laser display 71 includes a color synthesizing filter 80 for synthesizing a red color (R) laser beam, green color (G) laser beam, and blue color (B) laser beam, the light strengths of which are respectively modulated by GLV devices 78R, 78G, 78B; a space filter 82; a diffuser 84; a mirror 86; a Galvano scanner 88; a projecting optical system (a group of lenses) 90; and a screen 92. The color synthesizing filter 80 is composed of, for example, a dichroic mirror.

With the laser display 71 according to the embodiment, respective RGB laser beams of light emitted from the laser beam sources of 72R, 72G, 72G are incident upon the respective GLV devices 78R, 78G, 78B via each of the respective mirrors 74R, 74G, 74B and through respective illumination optical systems 76R, 76G, 76B. The respective laser beams of light are color-classified image signals, which are to be synchronously input in the GLV devices 78R, 78G, and 78B.

Further, the respective laser beams of light are modulated with respect to space by being diffracted by the GLV devices 78R, 78G, 78B, and these three color diffracted beams of light are synthesized by the color synthesizing filter 80, and only signal components are successively derived by the space filter 82.

Next, the RGB image signals have laser speckles reduced by the diffuser 84, and via the mirror 86 the signals are spread into space by Galvano scanner 88 synchronous to the signals so as to be projected onto the screen 92 as full color images by the projecting optical system 90.

Since the laser display 71 of this embodiment is equipped with the GLV devices 78R, 78G, 78B that have, as shown in FIG. 11, such a composition as a light modulation device, the light flux of image signals to be emitted improves in comparison with the laser display using a conventional light modulation device. As the light flux of signals improves, light-use efficiency of laser beams from the laser beam sources of 72R, 72G, 72G improves.

The laser display 71 of this embodiment is equipped with the GLV devices 78R, 78G, 78B corresponding to the respective color laser beam sources 72, and therefore the GLV device according to the present invention is capable of being applied to various types of displays having other compositions than the above.

For example, while the light source is made to be a white color, the light modulation devices 78R, 78G, 78B, each of which has a different beam width, may compose one pixel to display respective colors by reflecting only light having each of the wavelengths of Red, Green, and Blue (other light is diffracted).

Further, it is possible to make a white color light from a single light source enter the GLV device 78 through a color wheel that synchronizes with image information composed of RGB pixel data.

Furthermore, when, for example, the single GLV device 78 is used to be composed such that the device 78 reproduces color information on every pixel by diffracting light from a LED (light-emitting diode) of RGB, it becomes a simplified handy-type color display.

In addition, the GLV device according to the present invention can be used not only in the kinds of projectors such as the laser display of this embodiment but also as an optical switch in various kinds of optical devices, for example, various transmitting devices for WDM (Wavelength Division Multiplexing) in the optical communications, MUX (Multiplexer: parallel serial transducer/distribution apparatus) or OADM (Optical Add/Drop Multiplexer), OXC (Optical Cross Connect) and the like.

Moreover, the GLV device according to the present invention can be applied to other optical appliances such as a microscopic drawing apparatus that can directly draw, for example, digital images and the like, a semiconductor exposure apparatus, a printer engine, and the like.

Additionally, with the laser display 71 of the present embodiment, explanations have been made of the laser display that modulates with respect to space by means of the GLV devices 78R, 78G, and 78B. However, the GLV device of the present invention can perform the switching of information that can be modulated by interfering and diffracting a phase, the strength of light and the like, and can be applied to optical appliances thereof.

The invention claimed is:

1. An electrostatic drive type MEMS device, characterized by comprising a substrate side electrode and a beam that is disposed to oppose said substrate side electrode and that has a reflective film cum driving side electrode driven by electrostatic attraction force or electrostatic repulsion force that acts between the substrate side electrode and said driving side electrode, said substrate side electrode being formed of an impurities-doped conductive semiconductor region in a semiconductor substrate.

2. An electrostatic drive type MEMS device according to claim 1, wherein said conductive semiconductor region is electrically insulated from the peripheral region of said semiconductor substrate through being isolated by insulation by means of selective oxidation, or trench isolation.

3. The electrostatic drive type MEMS device according to claim 1, further comprising an insulative support part for supporting one end of said beam, wherein said beam opposes said substrate side electrode in a cantilever fashion.

4. The electrostatic drive type MEMS device according to claim 1, wherein said beam is disposed to oppose said substrate side electrode so as to straddle said substrate side electrode in a bridge-like fashion.

5. The electrostatic drive type MEMS device according to claim 1, further comprising a power supplying wiring for driving said substrate side electrode, wherein said power supplying wiring is formed of said impurities-doped conductive semiconductor region in said semiconductor substrate.

6. The electrostatic drive type MEMS device according to claim 5, further comprising:
  columnar support parts formed so as to surround said electrostatic drive type MEMS device; and
  a glass substrate placed upon said columnar support parts, wherein said columnar support parts and said glass substrate form a package for said electrostatic drive type MEMS device.

7. A manufacturing method of an electrostatic drive type MEMS device, characterized by comprising the processes of: forming a substrate side electrode that is insulated to be isolated from other parts by doping impurities onto the surface of a semiconductor substrate, selectively forming a sacrificial layer including the upper part of said substrate side electrode, forming a beam having a reflective film cum driving side electrode on said sacrificial layer, and removing said sacrificial layer.

8. A manufacturing method of an electrostatic drive type MEMS device according to claim 7, wherein said doping of impurities is carried out by means of an ion infusion method, a thermal diffusion method or a solid phase diffusion method.

9. An optical MEMS device, characterized by comprising a substrate side electrode and a beam that is disposed to oppose said substrate side electrode and that has a light reflective film cum driving side electrode driven by electrostatic attraction force or electrostatic repulsion force that acts between the substrate side electrode and said driving side electrode, said substrate side electrode being formed of an impurities-doped conductive semiconductor region in a semiconductor substrate.

10. The optical MEMS device according to claim 9, further comprising an insulative support part for supporting one end of said beam, wherein said beam opposes said substrate side electrode in a cantilever fashion.

11. The optical MEMS device according to claim 9, wherein said beam is disposed to oppose said substrate side electrode so as to straddle said substrate side electrode in a bridge-like fashion.

12. A light modulation device, characterized by comprising a substrate side electrode and a beam that is disposed to oppose said substrate side electrode and that has a light reflective film cum driving side electrode driven by electrostatic attraction force or electrostatic repulsion force that acts between the substrate side electrode and said driving side electrode, said substrate side electrode being formed of an impurities-doped conductive semiconductor region in a semiconductor substrate.

13. The light modulation device according to claim 12, further comprising an insulative support part for supporting one end of said beam, wherein said beam opposes said substrate side electrode in a cantilever fashion.

14. The light modulation device according to claim 12, wherein said beam is disposed to oppose said substrate side electrode so as to straddle said substrate side electrode in a bridge-like fashion.

15. A GLV device, characterized by comprising a common substrate side electrode and a plurality of beams that are independently disposed in parallel to each other to oppose said common substrate side electrode and that each have a light reflective film cum driving side electrode driven by electrostatic attraction force or electrostatic repulsion force that acts between the substrate side electrode and said driving side electrode, said substrate side electrode being formed of an impurities-doped conductive semiconductor region in a semiconductor substrate.

16. The GLV device according to claim 15, wherein each of said beams is disposed to oppose said common substrate side electrode so as to straddle said common substrate side electrode in a bridge-like fashion.

17. A laser display comprising a laser beam source and a GLV device that is disposed on an optical axis of the laser beam emitted from said laser beam source to modulate the strength of the laser beam, characterized in that said GLV device includes a common substrate side electrode and a plurality of beams that are independently disposed in parallel to each other to oppose said common substrate side electrode and that each have a light reflective film cum driving side electrode driven by electrostatic attraction force or electrostatic repulsion force that acts between the substrate side electrode and said driving side electrode, said substrate side electrode being formed of an impurities-doped conductive semiconductor region in a semiconductor substrate.

18. The laser display according to claim 17, wherein each of said beams of said GLV device is disposed to oppose said common substrate side electrode so as to straddle said common substrate side electrode in a bridge-like fashion.

* * * * *